(12) United States Patent
Venkataramani (10) Patent No.: US 7,569,109 B2
(45) Date of Patent: *Aug. 4, 2009

(54) SINGLE CRYSTAL SCINTILLATOR MATERIALS AND METHODS FOR MAKING THE SAME

(75) Inventor: Venkat Subramaniam Venkataramani, Clifton Park, NY (US)

(73) Assignee: General Electric Company, Schenectady, NY (US)

( * ) Notice: Subject to any disclaimer, the term of this patent is extended or adjusted under 35 U.S.C. 154(b) by 162 days.

This patent is subject to a terminal disclaimer.

(21) Appl. No.: 11/509,129

(22) Filed: Aug. 23, 2006

(65) Prior Publication Data
US 2008/0047482 A1 Feb. 28, 2008

(51) Int. Cl.
*C30B 1/02* (2006.01)
(52) U.S. Cl. .................... 117/4; 117/5; 117/8; 117/9
(58) Field of Classification Search ............... 117/4, 117/5, 8, 9
See application file for complete search history.

(56) References Cited

U.S. PATENT DOCUMENTS

| | | | | |
|---|---|---|---|---|
| 6,048,394 A | * | 4/2000 | Harmer et al. ............ | 117/8 |
| 6,143,366 A | * | 11/2000 | Lu ....................... | 427/376.3 |
| 6,967,330 B1 | | 11/2005 | Lempicki et al. | |
| 7,208,041 B2 | * | 4/2007 | Lee et al. ................ | 117/2 |
| 2005/0061982 A1 | | 3/2005 | Ichinose et al. | |
| 2006/0054863 A1 | | 3/2006 | Dai et al. | |

OTHER PUBLICATIONS

C. L. Melcher and J. S. Schweitzer; "Cerium-doped Lutetium Oxyorthosilicate: A Fast, Efficient New Scintillator"; IEEE Transactions on Nuclear Science, 1992, pp. 502-505, vol. 39, No. 4.
Bescher et al.; "New Lutetium Silicate Scintillators"; Journal of Sol-Gel Science and Technology 19, 2000, pp. 325-328.
Vinod K. Sarin; "Formation of Lutetium Silicate by Solid State Diffusion"; Jul. 2005 p. 1, Available at http://event.ua.pt/dsl2005/Sarin.pdf.

* cited by examiner

Primary Examiner—Robert M Kunemund
(74) Attorney, Agent, or Firm—Fletcher Yoder (57) ABSTRACT

A method of making a rare earth halide single crystal material is provided. The method includes providing a polycrystalline material having a plurality of grains. The method further includes adding a seed crystal to the polycrystalline material to define a plane of growth for the polycrystalline material. Further, the polycrystalline material having the seed crystal may be subjected to heat-treating, where the heat-treating does not include melting the polycrystalline material.

23 Claims, 6 Drawing Sheets

FIG. 7

SINGLE CRYSTAL SCINTILLATOR MATERIALS AND METHODS FOR MAKING THE SAME

CROSS-REFERENCE TO RELATED APPLICATIONS

The following commonly owned application is hereby incorporated by reference for all purposes:

U.S. patent application Ser. No. 11/509,128, filed concurrently herewith, entitled "Single Crystal Scintillator Materials and Methods for Making the Same" by Venkat Subramaniam Venkataramani et al.

BACKGROUND

The invention relates generally to scintillator materials for use in diagnostic imaging systems. In particular, the invention relates to methods of making single crystal scintillator materials and methods of using the same.

Typically, radiation is employed in a variety of fields such as medical diagnostics and non-destructive inspection. For example, X-ray computed tomography (CT) and a positron emission tomography (PET) are employed for medical diagnosis. Such X-ray or gamma ray radiation based devices employ a scintillator-based detector.

As will be appreciated, scintillators are generally used to convert gamma rays, X-rays or visible light into optical photons which can then be detected by a wide variety of different photosensors. Usually, it is desired to have a scintillator that has a high density, a short decay period of luminescence, and exhibits high resistance to radiation or stopping power. Further, in these applications, it is desirable to employ a transparent single crystal scintillator to enhance light properties.

However, transparent single crystals are difficult to grow, and are usually expensive due to high temperatures and expensive arrangements required to form the single crystals. Often single crystals are formed by converting their respective polycrystalline materials into melt form and subsequently growing a single crystal from the melt by using a seed crystal. These processes are expensive and time consuming. Further, there are limitations of the liquid solubility, which results in saturation of a species in a liquid melt beyond a concentration that exceeds solubility limits. Therefore, the composition of the scintillator materials is restricted in such methods by liquid solubility. For example, the amount of activator ions may be limited by the liquid state solubility of the activator ions in the melt. Furthermore, the activator ions may not be homogeneously distributed in the liquid melt or may not be homogeneously distributed in the single crystal formed from the liquid melt.

Accordingly, there is a need for methods of making a single crystal scintillator material, which has high transparency and desirable amounts of activator ion concentration, and is suitable for applications, such as CT and PET and that is cheaper and easier to make than by conventional techniques.

BRIEF DESCRIPTION

In accordance with one aspect of the present technique, a method of making a rare earth halide single crystal material is provided. The method includes providing a polycrystalline material having a plurality of grains. The polycrystalline material includes a rare earth halide. The method further includes adding a seed crystal to the polycrystalline material to define a plane of growth for the polycrystalline material. The seed crystal includes a rare earth halide. Further, the polycrystalline material having the seed crystal may be subjected to heat-treating, where the heat-treating does not include melting the polycrystalline material.

In accordance with another aspect of the present technique, a method for solid-state conversion of a polycrystalline composition to a rare earth halide single crystal composition is provided. The method includes heat-treating the polycrystalline composition to a temperature sufficient to reduce a porosity of the polycrystalline composition but insufficient to melt the polycrystalline composition. The polycrystalline material includes a rare earth halide. The method further includes growing at least one of a plurality of grains of the polycrystalline composition along a predetermined plane.

In accordance with yet another aspect of the present technique, a rare earth halide scintillator composition of an anisotropic material having an absorption coefficient in a range from about 0.001 $mm^{-1}$ to about 0.02 $mm^{-1}$ is provided.

In accordance with another aspect of the present technique, a method for solid-state conversion of a rare earth halide polycrystalline composition to a rare earth halide single crystal composition is provided. The method includes converting the rare earth halide polycrystalline composition to the rare earth halide single crystal composition via solid-state conversion. The method further includes growing at least one of a plurality of grains of the rare earth halide polycrystalline composition along a predetermined plane.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Single crystal materials are desirable in radiographic imaging applications. For example, in medical imaging applications, single crystal scintillators are used in the detection of radiographic radiation. The use of single crystal scintillators facilitates high light output of the imaging detector by enabling high optical transmission from the single crystal scintillator in the emission region. For medical imaging applications, such as computed tomography (CT), positron emission tomography (PET), it is desirable to employ single crystal materials having high light output along with a fast decay, and a fast rise time, as described in greater detail below with regard to FIGS. 4-7. As used herein, the term "light output" refers to a quantity of light emitted by a scintillator composition after excitation by a pulse of X-rays or gamma rays. "Decay time" refers to the time required for the intensity of the light emitted by the scintillator to decrease to a specified fraction of the light intensity after radiation excitation ceases. "Rise time" refers to the time required for a signal to rise from zero to full intensity. In single crystal scintillator compositions, the absence of scattering centers, such as grain boundaries, may result in relatively higher light outputs. Also, the single crystal scintillator composition may be useful in imaging systems, such as PET, where the amount of radiation incident on the scintillator composition may be relatively low.

For example, single crystal scintillator compositions of anisotropic materials such as lutetium silicate and lutetium yttrium silicate are suitable for such imaging applications. However, the processing techniques for making the single crystals are usually very expensive and difficult. Therefore, it is desirable to have relatively cheaper and easier methods of making a single crystal material for use in applications such as radiographic imaging systems.

In certain embodiments, a single crystal material may be formed by solid-state conversion of a polycrystalline material. In certain embodiments, the polycrystalline material may include a plurality of grains or crystallites, which may be separated by grain boundaries. As used herein, the term "solid-state conversion" refers to a conversion of a polycrystalline material into a single crystal without having to go through a liquid/melt stage. As will be described in detail below, the solid-state conversion may enable a higher concentration of doping elements. Also, solid-state conversion of a polycrystalline material may result in a single crystal material having a homogeneous distribution of doping throughout the single crystal material. For example, in case of a scintillator composition, solid-state conversion of a polycrystalline material scintillator composition may enable a high concentration of activator ions in the single crystal scintillator composition, and homogeneous dispersion of these activator ions throughout the single crystal scintillator composition. As used herein, the term "activator ion' refers to a dopant in a scintillator composition, which is raised to an excited state by absorbing radiation of suitable wavelengths, and returns to the ground state by emitting radiation.

In certain embodiments, the single crystal scintillator composition may include an anisotropic material. In an exemplary embodiment, the anisotropic material may include one or more rare earth halides. For example, the scintillator composition may include lutetium iodide, lutetium bromide, lutetium chloride, or combinations thereof. In another embodiment, the anisotropic material may include non-halide scintillator compositions such as lutetium silicate, lutetium phosphate, lutetium aluminate, lutetium oxyorthosilicate ($Lu_2SiO_5$), lutetium-yttrium oxyorthosilicate ($LuYSiO_5$), lutetium-aluminum perovskite ($LuAlO_3$), lutetium pyrosilicate ($Lu_2Si_2O_7$), yttrium-aluminum perovskite ($YAlO_3$), gadolinium oxyorthosilicate ($Gd_2SiO_5$), bismuth germinate ($Bi_4Ge_3O_{12}$), lead tungstate ($PbWO_4$), or combinations thereof In an exemplary embodiment, a concentration of the activator ions in the single crystal scintillator composition may be in a range from about 0.5 atomic percent to about 20 atomic percent. In certain embodiments, the absorption coefficient of the single crystal scintillator composition may be in a range from about 0.001 $mm^{-1}$ to about 0.02 $mm^{-1}$. In these embodiments, the scattering coefficient of the single crystal scintillator composition may be in a range from about 0.001 $mm^{-1}$ to about 0.05 $mm^{-1}$.

In certain embodiments, a polycrystalline material may be partially converted into a single crystal. The at least partial conversion of the polycrystalline material may result in a material that is predominantly single crystal, but may have portions which are polycrystalline in nature.

In certain embodiments, the single crystals so formed may include more than one grain. In one embodiment, each of the plurality of grains forms a low angle grain boundary with neighboring grains. The grain boundaries may appear at the surface of the single crystal or may be evident under strong illumination due to scattering by impurities on the small-angle grain boundaries. Single crystals having a few grain boundaries are sometimes referred to as "quasi-single" crystals. In an exemplary embodiment, the angle formed between the low angle grain boundaries is in a range from about 30 degrees to about 60 degrees. In this embodiment, the single crystal may be similar to a crystal having a planar laminar phase. The planar laminar phase prevents any refractive index change through the plane of the crystal, thereby resulting in high values of transparency of the single crystal material. In one embodiment, the crystal size of the single crystal may be in a range from about 1 micron to about 10 microns.

Figure 1:
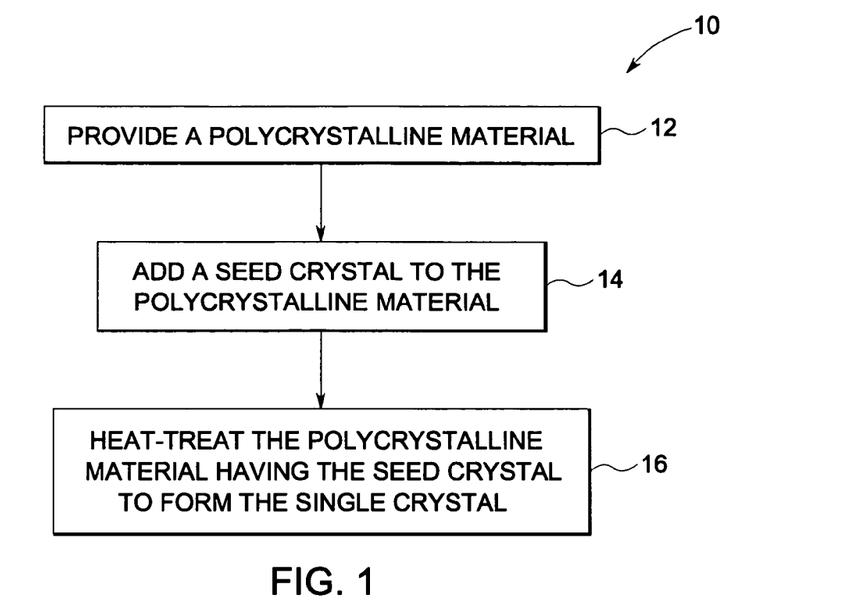
FIGS. 1-3 are flow charts illustrating exemplary methods for making single crystal scintillator materials according to certain embodiments of the present technique.

Referring now to FIG. 1, a flow chart 10 illustrating a method of making a single crystal is provided. In the illustrated embodiment, the single crystal is formed from a solid-state conversion of a polycrystalline material. In other words, the single crystal is formed from a polycrystalline material without having to convert the polycrystalline material in a melt form as otherwise used in conventional techniques such as the Bridgman-Stockbarger method, the Czochralski method, the zone-melting method, the floating zone method, or the temperature gradient method. These conventional methods generally include formation of a melt of the polycrystalline material, and other chemical components desired in the single crystal. For example, other chemical components in the melt of the polycrystalline material may include activator ions or other dopants desired in the single crystal of a scintillator composition. In these embodiments, the concentration of the activator ions and dopants in the resultant single crystal is governed by the liquid state solubility of these chemical components in the melt of the polycrystalline material. For example, the amount of the activator ions and the dopants may be maintained in a scintillator composition only up to the solubility saturation limit of the melt, thereby restraining the scintillator composition to certain optical performances. Also, the melt or liquid solution may result in a non-homogeneous distribution of chemical species in the single crystal, mostly due to segregation of one or more chemical components in the melt while forming of the single crystal.

The method illustrated in flow chart 10, includes providing a polycrystalline material (block 12). For example, the polycrystalline material may include a ceramic composition. In one embodiment, the polycrystalline material may include scintillator compositions such as lutetium iodide, lutetium silicate, lutetium phosphate, lutetium aluminate, or combinations thereof. As will be described in detail below with regard to FIG. 2, in some embodiments, the polycrystalline material may be provided in the powder form. Further, as will be described in detail below with regard to FIG. 3, in other embodiments, the polycrystalline material may be provided in the dense net shape form, i.e., a sintered solid shape.

Subsequently, at block 14 a seed crystal may be added to the polycrystalline material. In one embodiment, for making rare earth halide single crystal, the seed crystal may include lutetium iodide, lutetium bromide, lutetium chloride, or combinations thereof Whereas, for making non-halide single crystal, the seed crystal may include one or more of a lutetium silicate, lutetium phosphate, lutetium aluminate, lutetium oxyorthosilicate ($Lu_2SiO_5$), lutetium-yttrium oxyorthosilicate (LuYSiO$_5$), lutetium-aluminum perovskite (LuAlO$_3$), lutetium pyrosilicate (Lu$_2$Si$_2$O$_7$), yttrium-aluminum perovskite (YAlO$_3$), gadolinium oxyorthosilicate (Gd$_2$SiO$_5$), bismuth germinate (Bi$_4$Ge$_3$O$_{12}$), lead tungstate (PbWO$_4$), or other compounds that have a lattice match with the polycrystalline solid that is to be converted. In one embodiment, where the polycrystalline material includes barium titanate, the seed crystal may not be added separately. In this embodiment, excess titanium and silica (added as a source for oxygen) may be added along with other precursors of barium titanate. In this embodiment, excess titanium and silica may act as grain growth agents. In other embodiments, where the seed crystal is added separately, the choice of the seed crystal depends on the polycrystalline material. For example, for a given polycrystalline material, the seed crystal may be selected based upon the compatibility of the seed crystal with the polycrystalline material with regard to lattice parameters, a plane of growth, and/or a crystal phase. In one embodiment, the seed crystal may include a plane which is similar to the plane of growth of the polycrystalline material. For example, the seed crystal may be cut along the plane of growth of the polycrystalline material. In an exemplary embodiment, the seed crystal and the polycrystalline material may be of the same material. For example, both the seed crystal and the polycrystalline material may include lutetium silicate or lutetium iodide.

The polycrystalline material having the seed crystal is then subjected to heat-treatment (block 16) to grow the polycrystalline material into a single crystal. The temperature for the heat-treatment is maintained high enough to grow the single crystal and low enough to prevent the polycrystalline material from melting and converting to a liquid state. Non-limiting examples of the heat treatment may include processes such as annealing, sintering, hot isostatic pressing (HIP), or combinations thereof.

As noted above, the heat treatment at block 16 does not include melting the polycrystalline material. Therefore, the composition of the resulting single crystal is not limited by the liquid solubility constrains of the melt of the polycrystalline material. Also, the techniques involving the formation of a melt of the polycrystalline material may restrict the formation of a single crystal from chemical compositions not having similar melting points. In other words, single crystals having chemical compositions with incongruent melting points may not be possible by methods involving formation of a melt. Other challenges may include preventing the decomposition of the chemical species near the melting point, or phase change of one or more of the chemical species of the polycrystalline material close to the melting point. As discussed above and further described below, it is desirable/useful to form single crystals without having to form a melt of the polycrystalline material.

Figure 2:
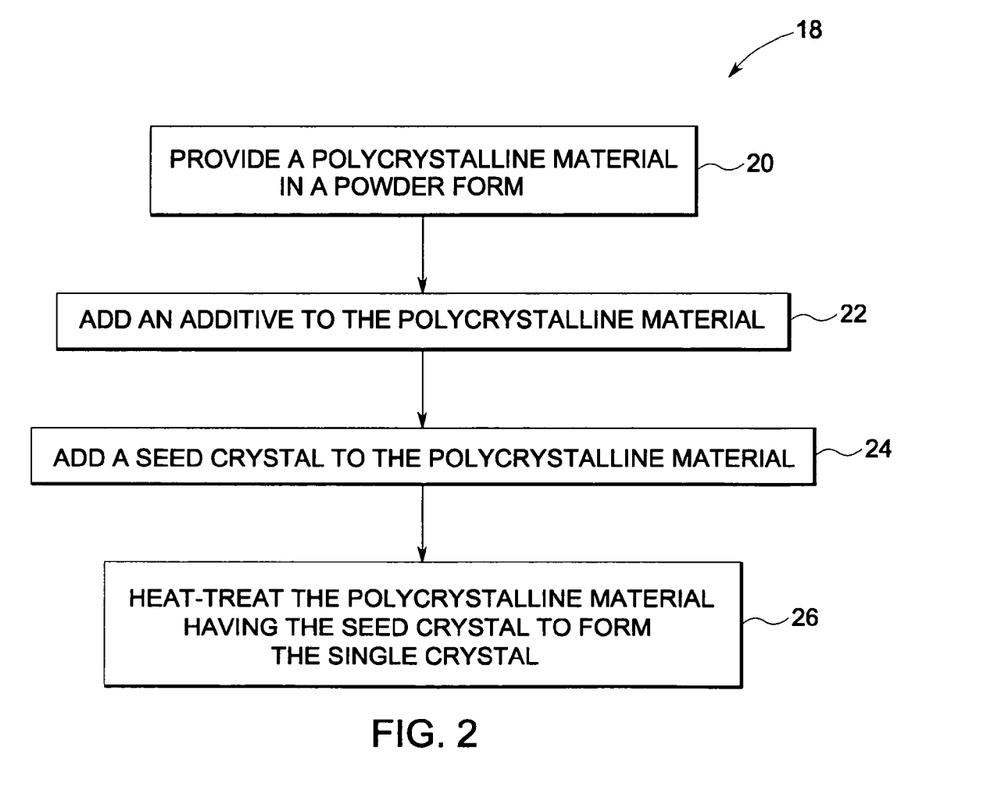

Turning now to FIG. 2, a flow chart 18 illustrating a method of making a single crystal from a polycrystalline material is depicted. The method includes providing a polycrystalline material in a powder form (block 20). In an exemplary embodiment, the polycrystalline material may be produced in a powder form by using known techniques. In an exemplary embodiment, the process of making the polycrystalline material in the powder form may include the steps of preparing a suitable powder mixture containing the ingredients in determined proportions. In one embodiment, the reactants may be supplied in powder form. For example, in embodiments where lutetium silicate is the polycrystalline material, one or more lutetium ion-containing reactants may be mixed with one or more silicon ion-containing reactants, and an activator ion-containing reactant.

Subsequently, the powder mixture may be prepared by mixing various forms of the reactants such as salts, oxides, halides, oxalates, carbonates, nitrates, or mixtures of two or more thereof. In an exemplary embodiment, the reactants may be oxygen-containing compounds, e.g., oxides, nitrates, acetates, oxalates, sulfates, phosphates, or combinations thereof Under specified conditions, the oxygen-containing compounds may decompose to a form of the desired compounds, e.g., silicate of lutetium having dopants, such as cerium.

At block 22, an additive may be added to the polycrystalline material. The additives may include grain growth promoting agents. In embodiments having single crystal material with a plurality of grains, the additives may facilitate growth of one or more of the grains. In one embodiment, additives may be highly mobile in the crystal lattice of the polycrystalline material, the movement of these additives may conclude in movement of the grain boundaries, thereby facilitating the growth of the single crystal. For example, calcium is highly mobile in the crystal lattice of lutetium silicate and therefore may act as an additive to facilitate crystal growth. In another embodiment, the additives may be added along with the precursor material for the polycrystalline material. In one embodiment, the additives may include lithium, aluminum, barium, titanium, boron, gallium, indium, cerium, magnesium, calcium, silicon, phosphorus, vanadium, halogen, or combinations thereof In the non-halide scintillator compositions, the additives may be present in the oxide. For example, in the non-halide scintillator compositions, the additives may include calcium oxide, titanium oxide, magnesium oxide, or cerium oxide. Additives, such as cerium oxide, may be used to enhance scintillating properties in addition to facilitating grain growth. In some embodiments, the additives may be added in the form of nitrates, or carbonates, which may then be converted into oxides in the scintillator composition. In halide scintillator compositions, the additives may be present in the element form.

Further, in the case of a scintillator composition, additional activator ions may also be provided to the polycrystalline material of the scintillator composition at this stage. In this embodiment, the activator ions may dope in the single crystal scintillator composition via solid-state diffusion. In one embodiment, the additives may be added to the resultant powder of the polycrystalline material.

In one embodiment, fluxing compounds may be added to the resultant polycrystalline material, or to the precursors of the polycrystalline material. The fluxing compounds may be added after the polycrystalline material is produced in powder form. Alternatively, the fluxing compounds may be present in the form of impurities in the precursors. The impurities originating from the precursor materials may constitute less than about 0.1 percent of the weight of the polycrystalline material. The additives may be added to facilitate higher sintered density of the final product. For example, in case of scintillator compositions, the flux may provide a higher density of a scintillation element formed upon compaction of the polycrystalline material. As will be appreciated, a scintillation element with higher density may have relatively increased absorption of the incident photons. Also, the scintillation element having a higher density may have less photon scattering. Less photon scattering may enhance the light output of the scintillation element. Additionally, by-products of the reactions may be present in the resultant powder mixture of the polycrystalline material in determined amounts.

In one embodiment, the fluxing compound may include a halide of sodium, potassium, rubidium, cesium, yttrium, lanthanum, cerium, praseodymium, neodymium, promethium, samarium, europium, gadolinium, terbium, dysprosium, holmium, erbium, thulium, ytterbium, tungsten, or combinations of two or more thereof. In one embodiment, the fluxing compound may be present in a range from about 0.001 mole percent to about 2 mole percent.

The mixing of the reactants including the precursor materials, additives, fluxing compounds may be carried out by using an agate mortar and pestle. Alternatively, a blender or pulverization apparatus may be used, such as a ball mill, a bowl mill, a hammer mill, or a jet mill. After blending, the mixture is fired under temperature and time conditions sufficient to convert the mixture into a solid solution. As used herein, the term "solid solution" refers to a mixture of the precursors in solid, crystalline form, which may include a single phase, or multiple phases.

Firing may be carried out in oxygen, nitrogen, helium, neon, argon, krypton, and xenon. After firing is complete, the resulting material may be pulverized, to put the polycrystalline material into powder form.

At block 24, a seed crystal is added to the resultant polycrystalline material powder. Subsequently, at block 26, the powder of the polycrystalline material having the seed crystal may be subjected to heat treatment such as sintering to facilitate crystal growth. In certain embodiments, the seed crystal may be disposed at the bottom of the polycrystalline material powder during sintering. In these embodiments, the grain growth may occur in the proximity of the seed crystal. The grain growth near the seed crystal may have a region resembling a single crystal.

In certain embodiments, sintering may be performed at a temperature in a range from about 500° C. to about 1900° C. Further, sintering may be performed in various atmospheres depending on the end product. In one embodiment, the sintering may be performed in an inert atmosphere.

Figure 3:
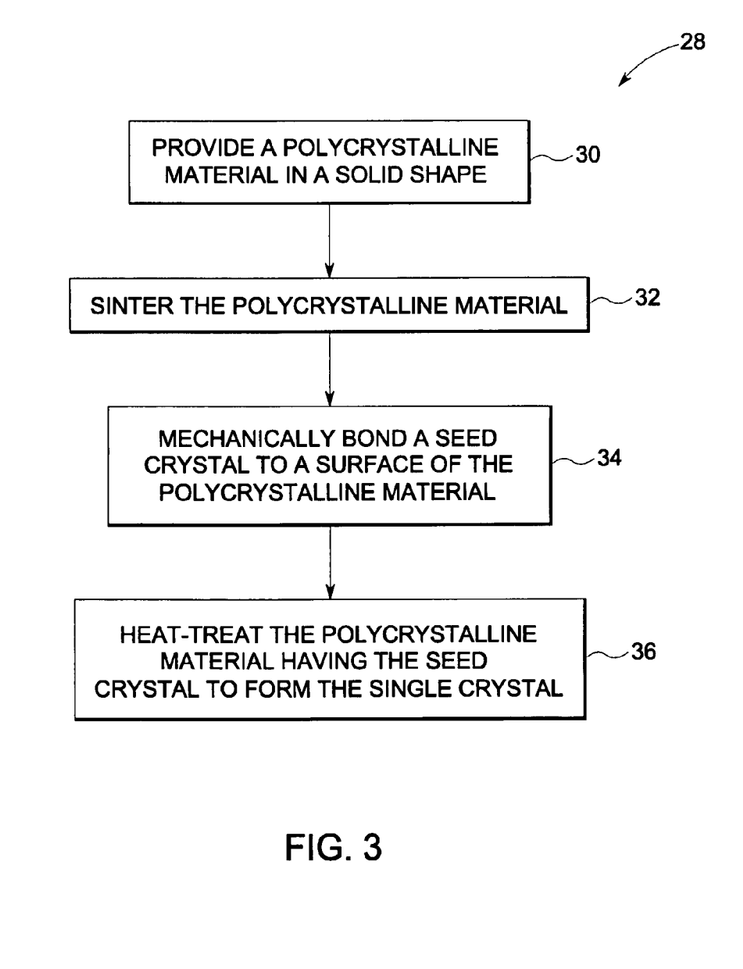

Referring now to FIG. 3, a flow chart 28 illustrating an alternate embodiment of a method of making a polycrystalline material is provided. The process starts at block 30, by providing a polycrystalline material. In one embodiment, the polycrystalline material may be in the form of a solid shape or a crystal. At block 32, the polycrystalline material may be subjected to sintering to densify the scintillator material. As used herein, the term "densifying" refers to increasing the density of the polycrystalline material, thereby reducing the porosity of the material. Subsequent to densifying, a seed crystal may be provided, as indicated in block 34. In the presently contemplated embodiment, the seed crystal may be mechanically bonded onto the surface of the polycrystalline material. In one embodiment, the seed crystal may be cut along a preferred plane of growth. Subsequently, the seed crystal may be polished and coupled to the polycrystalline material at the plane of growth. In one embodiment, the surface of the polycrystalline material to which the seed crystal is bonded may be oriented along the preferred growth plane of the polycrystalline material. The growth of the polycrystalline material along a preferred plane may be facilitated by providing a seed crystal having a similar growth plane as that of the polycrystalline material. For example, in one embodiment, a seed crystal cut along a <111> plane may be mechanically bonded to the polycrystalline material having a <111> plane of growth. In an exemplary embodiment, the seed crystal may be coupled to the surface of the polycrystalline material via an adhesive layer.

At block 36, the polycrystalline material having the seed crystal mechanically bonded to the surface may be subjected to heat treatment to facilitate the conversion of at least a portion of the polycrystalline material to a single crystal. Upon heating, the material from the crystallites of the polycrystalline material is transported outward from the crystallites to the grain boundaries of the polycrystalline material, thereby shifting the grain boundaries outward and resulting in grain growth or crystallite growth.

The single crystal scintillator composition may be employed in various applications including medical, industrial and/or research. In one embodiment the single crystal scintillator composition is employed in radiographic medical imaging, such as positron emission tomography (PET), in which a radioactive substance is administered to a patient and then traced within the patient's body by an instrument that detects the decay of the radioactive isotope, as will be described in more detail below with reference to FIGS. 4 and 5. In PET, a chemical tracer compound having a desired biological activity or affinity for a particular organ is labeled with a radioactive isotope that decays by emitting a positron. The emitted positron loses most of its kinetic energy after traveling only a few millimeters in a living tissue. The positron is susceptible to interaction with an electron, an event that annihilates both particles. The mass of the two particles (positron+electron) is converted into 1.02 MeV of energy, divided equally between two 511 keV photons (gamma rays). The two photons are emitted simultaneously and travel in almost exactly opposite directions. The two photons penetrate the surrounding tissue, exit the patient's body, and are absorbed and recorded by photo detectors arranged in a circular array. Tracing the source of the radiation emitted from the patient's body to the photo detectors can assess biological activity within an organ under investigation.

The economic value of PET as a clinical imaging technique may relate to the performance of the photo detectors. Each photodetector includes a scintillator cell or pixel. The scintillator cell or pixel may couple to one or more photomultiplier tubes. The scintillator cell produces light at the two points where the 511 KeV photons impact the scintillator cells. The light produced by the two scintillator cells is sensed by the corresponding coupled photomultiplier tubes. Approximate simultaneous interaction of the photons on the scintillator cells indicate the presence of a positron annihilation along the line joining the two points of interaction. The photomultiplier tubes generate an electrical signal in response to the produced light. By measuring the slight difference in arrival times (time of flight) of the two photons at the two points in scintillator cell, the position of positron can be calculated. The electrical signals from the photomultiplier tubes are processed to produce an image of the patient's organ.

The density of a detector element, including a single crystal scintillator composition, allows reduced thickness of the film of the scintillator composition. The reduced thickness may allow for reduced scattering of the photons in the detector element including the scintillator composition.

The scintillator composition may be employed in a time-of-flight (TOF) radiation detector. An exemplary measure of the efficacy of the TOF detector is the number density of photons per unit time. TOF refers to the transit of the photons from their source in the body to the PET scanner's scintillator ring. In a TOF detector, the detection of a photon by a detector of the detector ring or the scintillator ring results in the opening of an electronic time window, during which detection of a photon at the other detector of the detector ring results in the counting of a coincidence event. Not only are the photons detected inside the time window, but also the difference in time-of-flight between the two photons is measured and used to estimate a more probable location of the annihilation point along the line. This may reduce the signal to noise ratio and may boost the image quality. Measuring the slight difference in the arrival times of two photons emitted from the same positron with sufficiently good timing resolution may determine where along the line the positron was originally located within the target.

Although, the single crystal scintillator composition is described with respect to a PET imaging system, the single crystal scintillator composition may be used in other applications that benefit from similar properties. For example, the scintillator composition may be a down-hole detector or well-logging tool.

The well-logging tool may include a detector assembly coupled to a tool housing. The detector assembly employs a scintillator composition according to an exemplary embodiment and a light-sensing device (e.g., photomultiplier tube) optically coupled together by an optical interface. The light-sensing device converts the light photons emitted from the scintillator composition into electrical pulses that are shaped and digitized by associated electronics. The detector assembly captures radiation from the surrounding geological formation. The radiation may be converted into light. The generated light transmits to the light-sensing device. The light impulses transform into electrical impulses. The single crystal scintillator composition, the light-sensing device, and the optical interface may be sealed inside a detector housing. The optical interface includes a window coupled to the detector housing. The window facilitates radiation-induced scintillation light to pass out of the detector housing for measurement by the light-sensing device. The optical window may be made of a material that is transmissive to scintillation light given off by the scintillator composition. The detector casing may be made of metal, such as stainless steel, or aluminum. A detector cable connects the detector assembly to a power source and data processing circuitry. Data based on the impulses from the photomultiplier tube may be transmitted "up-hole" to analyzing equipment and the data processing circuitry. Alternatively, the data may be stored locally downhole. The data processing unit electrically couples to an operator workstation. The operator workstation couples to an output device.

Sometimes the data may be obtained and transmitted while drilling, i.e., "measurements while drilling" (MWD). The scintillation element in the well-logging tool can function at high temperatures and under harsh shock and vibration conditions. The scintillator composition may have one or more properties discussed previously, e.g., high light output and energy resolution, as well as fast decay time. The scintillator composition fits in a package suitable for a constrained space. The threshold of the acceptable properties has been raised considerably as drilling is undertaken at much greater depths.

Figure 4:
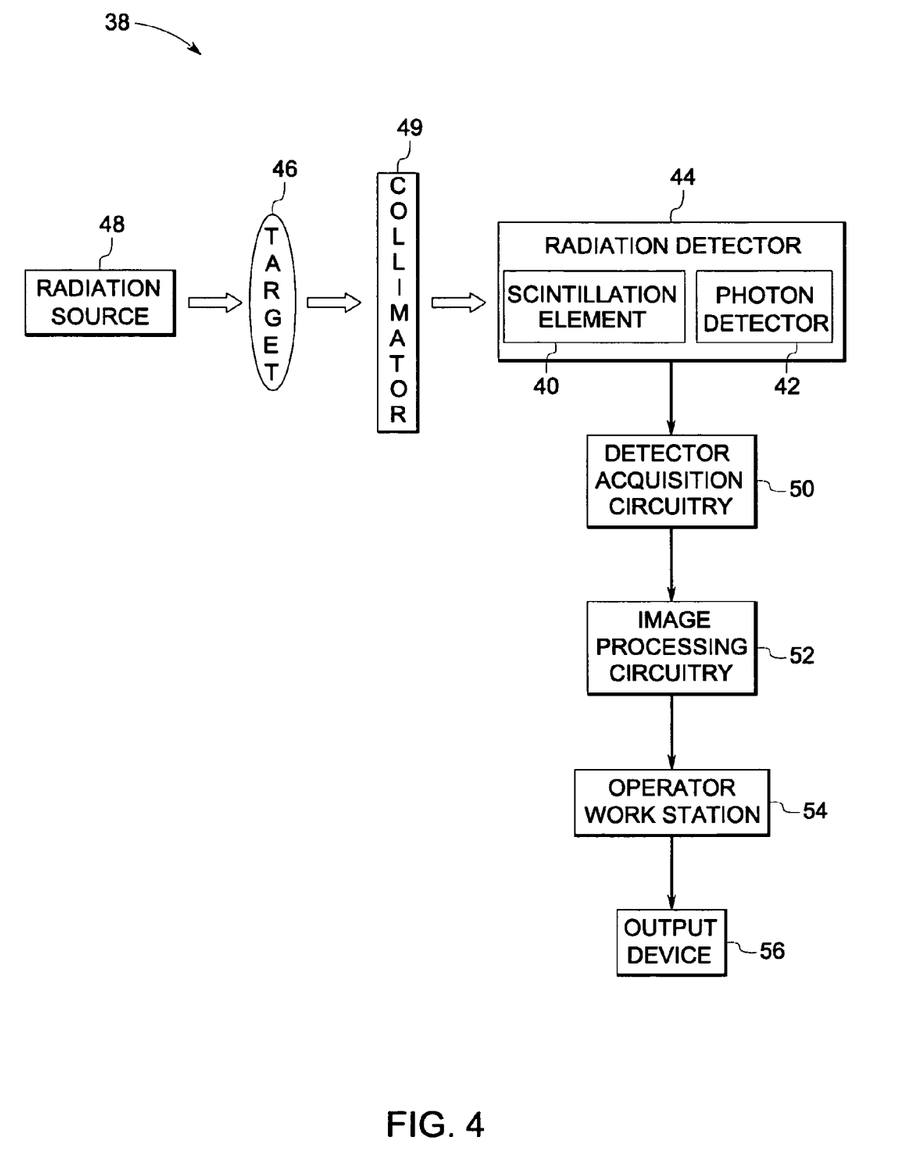
FIG. 4 is a diagrammatical representation of an exemplary positron emission tomography (PET) imaging system employing a scintillator composition according to certain embodiments of the present technique.

Referring to FIG. 4, an exemplary positron emission tomography (PET) imaging system 38 employing a scintillation element 40 and a photon detector 42 in a radiation detector 44 is illustrated. The scintillation element 40 employs a single crystal scintillator composition according to embodiments of the present technique. The photon detector 44 detects photons produced by the scintillation element 40. The photon detector 44 includes a photomultiplier tube, a photodiode, a charge-coupled device (CCD) sensor, and an image intensifier. The photon detector 44 may be coupled to a photomultiplier tube to enhance the electrical signals produced by the photon detector 44. The imaging system 38 processes the electrical signals to construct an image of the internal features within the target 46. A collimator 49 may collimate beams directed towards the radiation detector 44. Collimation may enhance the absorption percentage of the incident light on the radiation detector 44.

The radiation detector 44 is coupled to detector acquisition circuitry 50. The acquisition circuitry 50 controls acquisition of the signals generated in the photon detector 44. The imaging system 38 may include a motor subsystem (not shown) to facilitate motion of the radiation source 48 and/or the detector 44. The image processing circuitry 52 examines protocols and processes acquired image data from the detector acquisition circuitry 50.

As an interface to the imaging system 38, one or more operator workstations 54 may be included for outputting system parameters, requesting examination, viewing images, and so forth. The operator workstation 54 enables an operator, via one or more input devices (keyboard, mouse, touchpad, etc.), to control one or more components of the imaging system 38 if necessary. The illustrated operator workstation 54 couples to an output device 56, such as a display or printer, to output the images generated during operation of the imaging system 38. Displays, printers, operator workstations, and similar devices may be local or remote from the imaging system 38. For example, these interface devices may be positioned in one or more places within an institution or hospital, or in a different location. Therefore, the interface devices may be linked to the imaging system 38.

Figure 5:
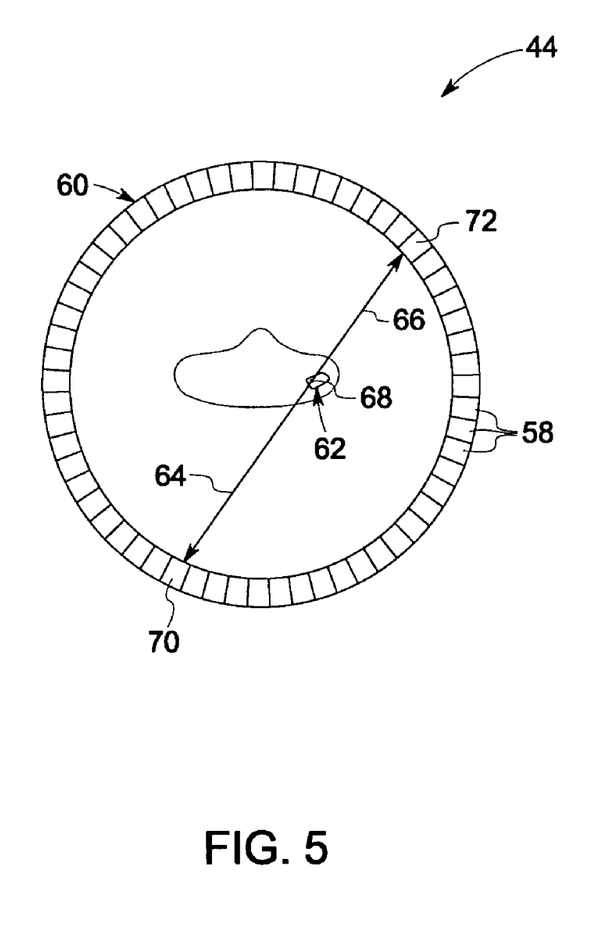
FIG. 5 is a front view of a scintillator ring used in a radiation detector of a positron emission tomography (PET) imaging system according to certain embodiments of the present technique.

FIG. 5 is a cross sectional view of the radiation detector 44 employed in the PET imaging system 38 shown in FIG. 4. In the illustrated embodiment, the radiation detector 44 employs a plurality of detector elements 58. The detector elements 58 are arranged around the target in a cylindrical configuration with a circular cross section. The circular cross section enables the two photons penetrated out of the target to reach any two opposite detector elements located on the scintillator ring 60 of the scintillation element 40 (FIG. 4). The scintillator ring 60 includes one or more layers of the scintillation elements 40. The ring 60 is disposed over a layer of photon detectors. The scintillation elements 40 include pixels, each of which couples to a pixel of the photon detector (not shown). In other words, one or more layers having an array formed by the pixels of the scintillation element 40 may be disposed over another layer, which is formed by an array of the pixels of the photon detector 42.

In the illustrated embodiment, a target having a radioactive isotope localized in a biologically active region 62 is disposed inside the radiation detector 44. As described above, the radioactive isotope emits a positron upon decay. The decay is a beta decay. The emitted positron travels at a high speed and is slowed to smaller speeds due to collisions with neighboring atoms. Once the positron is slowed, the annihilation reaction takes place between the positron and an outer-shell electron of one of the neighboring atoms. The annihilation reaction produces two 511 KeV photons or gamma rays, which travel in almost exactly opposite directions as shown by arrows 64 and 66 due to conservation of energy and momentum. The two detector points along with the origin point 68 of the photon in the biologically active region 62 form a straight line. The origin point 68 in the biologically active region 62 occurs along a straight line connecting the two detector elements 70 and 72. The two photons traveling in the direction shown by the arrows 68 and 70 reach the detector elements 70 and 72 respectively, such that the points 68, 70 and 72 lay on the same straight line. Simultaneous detection of photons on two points of the scintillator ring 40 indicates existence of the radioactive isotope in an identifiable location. The location is associated with a biologically active area in a human target.

Figure 6:
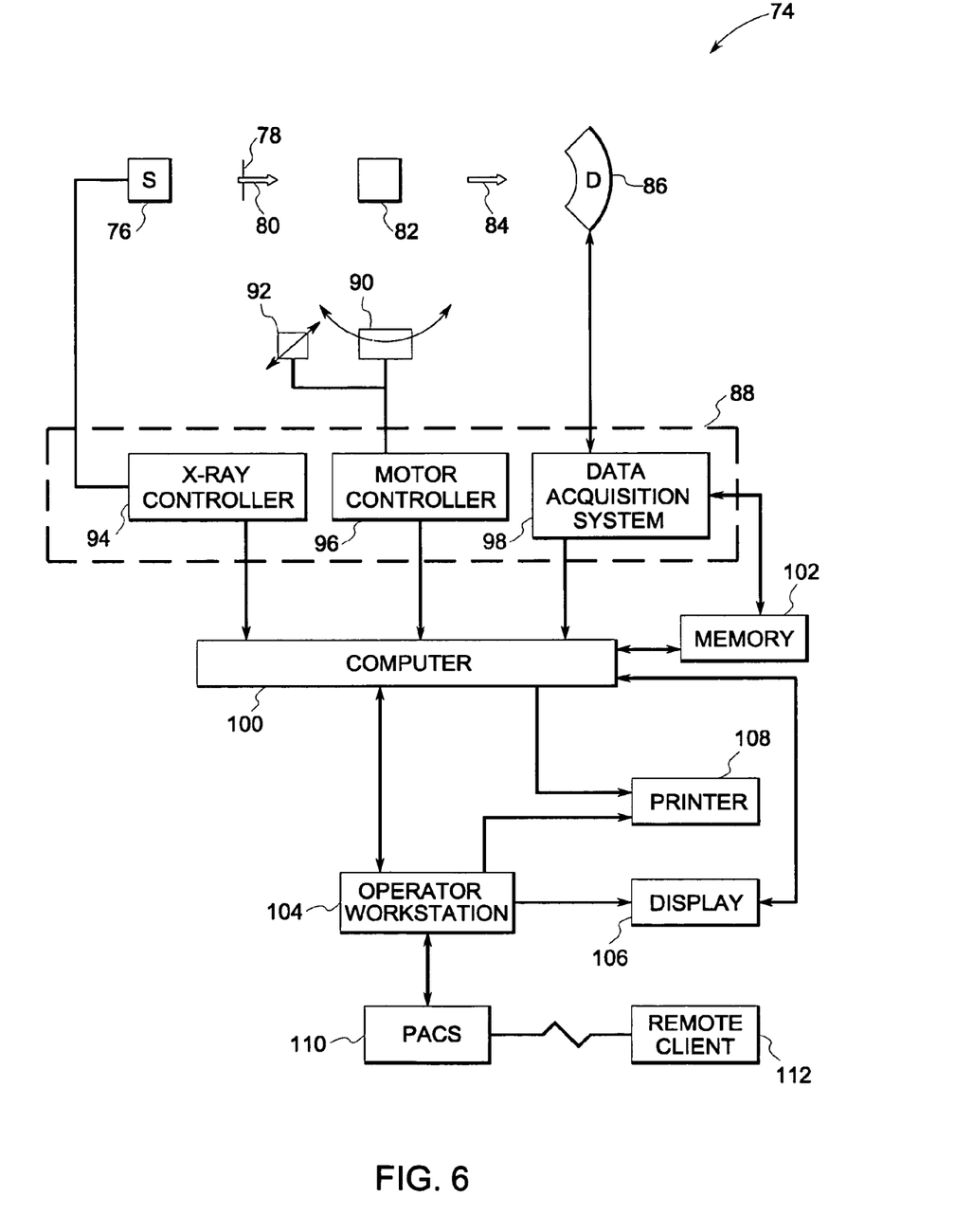
FIGS. 6 is a diagrammatical representation of an exemplary computed tomography (CT) imaging system employing a scintillator composition according to certain embodiments of the present technique.

FIG. 6 illustrates a computed tomography (CT) system 74 designed both to acquire original image data, and to process the image data for display and analysis. In the embodiment illustrated, the imaging system 74 includes a source of X-ray radiation 76 positioned adjacent to a collimator 78. Collimator 78 permits a stream of radiation 80 to pass into a region in which an object 82 is positioned. A portion 84 of the radiation 80 passes through or around the subject and impacts a detector array, represented generally at reference numeral 86. Detector elements of the array produce electrical signals that represent the intensity of the incident X-ray beam. These signals are acquired and processed to reconstruct images of the features within the subject 82.

Source 76 is controlled by a system controller 88, which furnishes both power, and control signals for CT examination sequences. In the embodiment illustrated, the system controller 88 is coupled to a rotational subsystem 90 and a linear positioning subsystem 92. The rotational subsystem 90 enables the X-ray source 76, collimator 78 and the detector 86 to be rotated one or multiple turns around the subject 82. It should be noted that the rotational subsystem 90 might include a gantry. The linear positioning subsystem 92 enables the subject 82, or more specifically a table, to be displaced linearly. Thus, the table may be linearly moved within the gantry to generate images of particular areas of the subject 82.

Additionally, the source of radiation may be controlled by an X-ray controller 94 disposed within the system controller 88. A motor controller 96 may be utilized to control the movement of the rotational subsystem 90 and the linear positioning subsystem 92.

Further, the system controller 88 is also illustrated comprising a data acquisition system 98. In this exemplary embodiment, the detector 86 is coupled to the system controller 88, and more particularly to the data acquisition system 98. The data acquisition system 98 receives data collected by readout electronics of the detector 88.

The processor 100 is typically coupled to the system controller 88. The data collected by the data acquisition system 98 may be transmitted to the processor 100 and moreover, to a memory 102. The memory 102 may be located at this acquisition system or may include remote components for storing data, processing parameters, and routines described below. Also the processor 100 is configured to receive commands and scanning parameters from an operator via an operator workstation 104 typically equipped with a keyboard and other input devices. An operator may control the system 74 via the input devices.

A display 106 coupled to the operator workstation 104 may be utilized to observe the reconstructed image and to control imaging. Additionally, the scanned image may also be printed by a printer 108 which may be coupled to the operator workstation 104. The display 106 and printer 108 may also be connected to the processor 100, either directly or via the operator workstation 104. Further, the operator workstation 104 may also be coupled to a picture archiving and communications system (PACS) 110, which in turn may be coupled to a remote system 112, radiology department information system (RIS), hospital information system (HIS) or to an internal or external network, so that others at different locations may gain access to the image and to the image data.

Figure 7:
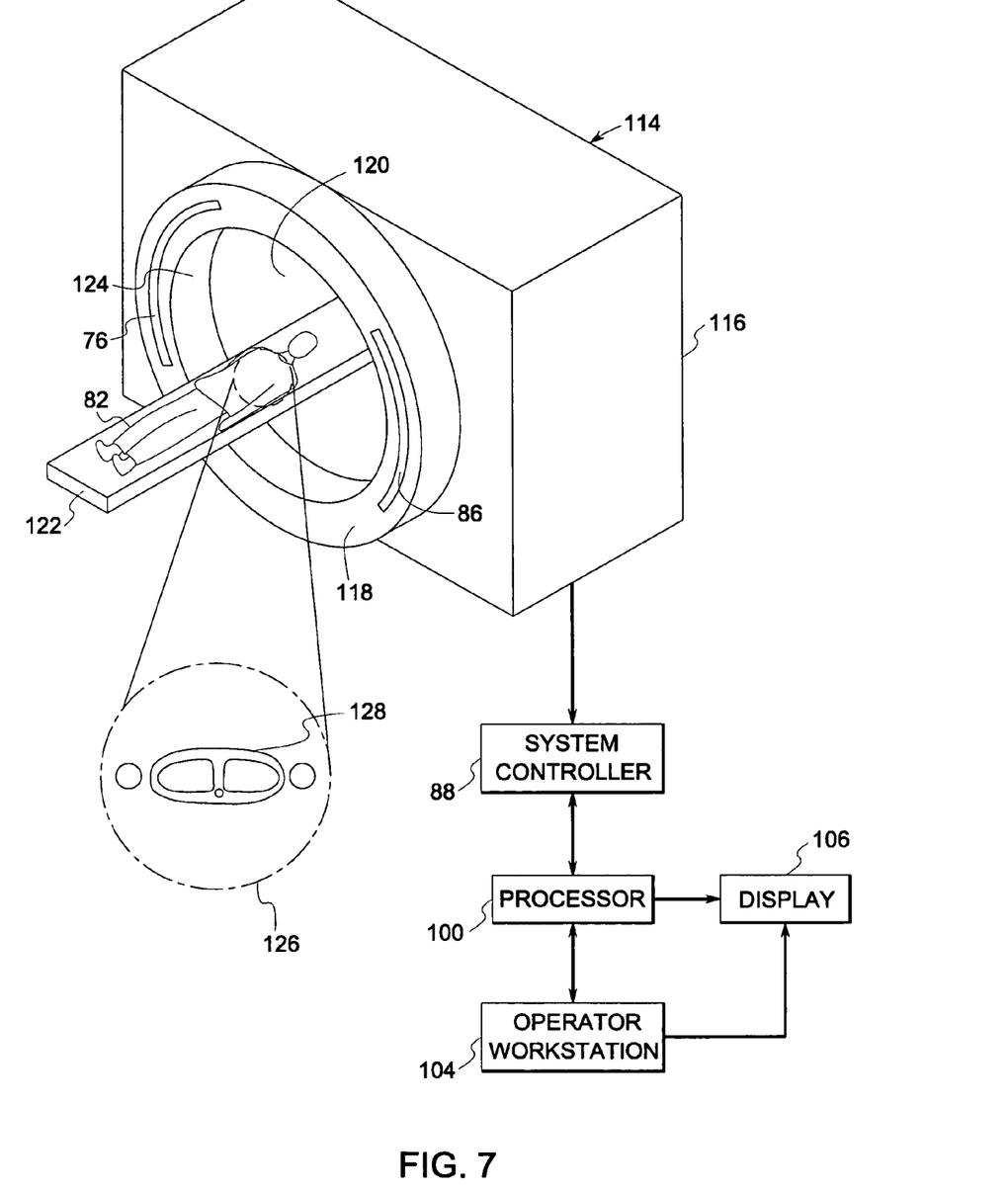
FIG. 7 is a diagrammatical representation of a physical implementation of the CT system of FIG. 6.

Referring now to FIG. 7, an exemplary imaging system utilized in a present embodiment may be a CT scanning system 114. The CT scanning system 114 is typically a multi-slice detector CT (MDCT) system that offers a wide array of axial coverage, high gantry rotational speed, and high spatial resolution. The CT scanning system 114 is illustrated with a frame 116 and a gantry 118 that has an aperture 120. The aperture 120 may be 50 cm in diameter, for example. Further, a table 122 is illustrated positioned in the aperture 120 of the frame 116 and the gantry 118. Additionally, the table 122 is configured to be displaced linearly by the linear positioning subsystem 92 (see FIG. 6). The gantry 118 is illustrated with the source of radiation 76, typically an X-ray tube that emits X-ray radiation from a focal point 124. In typical operation, X-ray source 76 projects an X-ray beam from the focal point 124 toward detector array 86. The detector 86 is generally formed by a plurality of detector elements, which sense the X-ray beams that pass through and around a subject of interest. Each detector element produces an electrical signal that represents the intensity of the X-ray beam at the position of the element at the time the beam strikes the detector. Furthermore, the gantry 118 is rotated around the subject of interest so that a plurality of radiographic views may be collected by the processor 100. Thus, an image or slice is computed which may incorporate, in certain modes, less or more than 360 degrees of projection data, to formulate an image. The image is collimated to desired dimensions, using either lead shutters in front of the X-ray source 76 and different detector apertures.

Data collected from the detector 86 then undergoes pre-processing and calibration to condition the data to represent the line integrals of the attenuation coefficients of the scanned objects. The processed data, commonly called projections, are then filtered and back-projected to formulate an image of the scanned area. As mentioned above, the processor 100 is typically used to control the entire CT system 74. The main processor that controls the operation of the system may be adapted to control features enabled by the system controller 88. Further, the operator workstation 104 is coupled to the processor 100 as well as to a display, so that the reconstructed image may be viewed. As illustrated, the image 126 may be displayed to show these features, such as indicated at reference numeral 128.

Without further elaboration, it is believed that one skilled in the art can, using the description herein, utilize the present invention to its fullest extent. The following examples are included to provide additional guidance to those skilled in the art in practicing various exemplary embodiments of the invention. The examples provided are merely representative of the work that contributes to the teaching of the present application. Accordingly, these examples are not intended to limit the invention, as defined in the appended claims, in any manner.

EXAMPLE 1

Single crystal lutetium oxyorthosilicate was prepared by using commercially available lutetium oxide obtained from PIDC Inc. (Ann Arbor, Mich. U.S.). The lutetium oxide powder was ground in ethyl alcohol using yttria stabilized zirconia grinding media. The grinding media had a diameter of 5 mm. Subsequent to grinding, the specific surface area, which is indicative of primary particle size, was changed from 2.62 $m^2/g$ to 10.95 $m^2/g$ indicating particle size reduction by grinding for 24 hours in a ball mill. A fumed silica powder obtained from Degussa (Parsippany, N.Y., U.S.) and having a specific surface area of 300 $m^2/g$ was mixed with the lutetium oxide powder. Phase pure lutetium oxyorthosilicate was formed by calcining the mixture at 1300° C. for one hour. The phase of the calcined lutetium oxyorthosilicate powder was found to remain stable after sintering up to 1850° C. Further, there was no residual or unreacted lutetium oxide phase. Subsequently, the calcined powder was milled for four hours to break the aggregates formed during calcination. Powders were then compacted by pressing in cylindrical quarter inch molds at 5 MPa. Subsequently, the powders were isostatically pressed at 200 MPa to form pellets. The pellets were then sintered at temperatures of 1600° C. to 1800° C. for a period of time ranging from 2 hours to 20 hours to obtain grain sizes of 1.7 microns, 2.1 microns, 5 microns, or 11.7 microns. Also, the sintered densities for the grain sizes of 1.7 microns, 2.1 microns, 5 microns, or 11.7 microns were measured by the Archimedes method were 7.40, 7.43, 7.41 and 7.32 g/cm$^3$, respectively. The grain size of more than 10 microns was achieved after sintering for 20 hours at 1800° C.

EXAMPLE 2

Six different additives were selected to conduct single crystal growth of calcined lutetium yttrium oxyorthosilicate powder. The chosen additives were magnesium oxide, calcium oxide, barium oxide, cerium oxide, titanium oxide, and aluminum oxide. The additives were added to a calcined lutetium yttrium oxyorthosilicate powder. The additives were added in the form of nitrates, carbonates or oxides. Magnesium was added in the form of $Mg(NO_3)_2$, calcium was added in the form of $Ca(NO_3)_2$, barium was added in the form of $Ba(NO_3)_2$, cerium was added in the form of $Ce_2(CO_3)_3$, titanium was added in the form of filmed $TiO_2$, and aluminum was added in the form of $\gamma$-$Al_2O_3$, by stirring with magnetic stirrer. All the additives but $Ba(NO_3)_2$ were mixed in ethyl alcohol because they completely dissolve in ethyl alcohol. However, $Ba(NO_3)_2$ showed solubility only in water and was processed in distilled water. Doping amounts were varied between 0.5 mole percent, 3 mole percent, and 8 mole percent for additives. A single crystal of the additives was embedded inside the powder compact by lightly pressing half of the pellet and placing a small 100 microns thick lutetium yttrium oxyorthosilicate crystal in the middle of the pellet and then re-pressing after adding the other half of powder in steel mold. The uniaxially pressed pellets were then isotatically pressed at 200 MPa. Samples were sintered at 1800° C. for 20 hours in vacuum. As illustrated in Table 1, grain growth was observed in lutetium yttrium oxyorthosilicate powders having these additives. For example, for 8 percent calcium oxide, approximately 70 percent of the ceramic pellet was converted into single crystal.

TABLE 1

| Additives/Amounts | 0.5 mole percent | 3 mole percent | 8 mole percent |
| --- | --- | --- | --- |
| Magnesium Oxide | 0 | 70 | 80 |
| Calcium Oxide | 70 | 100 | 30 |
| Barium Oxide | 5 | N/A | 3 |
| Cerium Oxide | 0 | 20 | 0 |
| Titanium Oxide | 0 | 2 | 30 |
| Aluminum Oxide | 0 | 10 | 5 |

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A method of making a rare earth halide single crystal material, comprising:
   providing a polycrystalline material comprising a plurality of grains, wherein the polycrystalline material comprises a rare earth halide;
   adding a seed crystal to the polycrystalline material to define a plane of growth for the polycrystalline material, wherein the seed crystal comprises a rare earth halide; and
   heat-treating the polycrystalline material having the seed crystal to form the single crystal, wherein the heat-treating does not include melting the polycrystalline material.

2. The method of claim 1, wherein the polycrystalline material comprises an additive to facilitate growth of at least one of the plurality of grains.

3. The method of claim 2, wherein the additive comprises lithium, aluminum, barium, titanium, boron, gallium, indium, cerium, magnesium, calcium, silicon, phosphorus, vanadium, halogen, or combinations thereof.

4. The method of claim 1, further comprising densifying the polycrystalline material prior to adding the seed crystal to the polycrystalline material.

5. The method of claim 4, wherein densifying the polycrystalline material comprises hot pressing, sintering, hot isostatic pressing, or combinations thereof.

6. The method of claim 1, wherein adding the seed crystal comprises mechanically bonding the seed crystal on a surface of the polycrystalline material.

7. The method of claim 1, wherein providing the polycrystalline material comprises forming the polycrystalline material by processing precursor materials in a powder form.

8. The method of claim 7, wherein adding the seed crystal comprises providing the seed crystal during formation of the polycrystalline material from the precursor materials in the powder form.

9. The method of claim 1, wherein heat-treating comprises annealing the polycrystalline material in a predetermined atmosphere, hot pressing, hot isostatic pressing, or combinations thereof.

10. The method of claim 1, wherein the rare earth halide single crystal material comprises a ceramic composition.

11. The method of claim 1, wherein the rare earth halide single crystal material comprises a scintillator composition.

12. The method of claim 11, wherein the scintillator composition comprises lutetium iodide, lutetium chloride, lutetium bromide, or combinations thereof.

13. The method of claim 11, wherein the scintillator composition further activator ions.

14. The method of claim 13, wherein the activator ions are added to the scintillator composition during formation of the polycrystalline material.

15. The method of claim 13, wherein the activator ions are added to the scintillator composition after the formation of the polycrystalline material by solid-state diffusion.

16. The method of claim 15, wherein the activator ions are present in an amount in a range of from about 0.5 atomic percent to about 20 atomic percent.

17. The method of claim 11, wherein the seed crystal comprises lutetium iodide, lutetium chloride, lutetium bromide, or combinations thereof.

18. The method of claim 11, wherein the scintillator composition is anisotropic.

19. The method of claim 1, wherein the seed crystal comprises same chemical composition as the polycrystalline material.

20. A method for solid-state conversion of a polycrystalline composition to a rare earth halide single crystal composition, comprising:
   heat-treating the polycrystalline composition to a temperature sufficient to reduce a porosity of the polycrystalline composition but insufficient to melt the polycrystalline composition, wherein the polycrystalline composition includes a rare earth halide; and
   growing at least one of a plurality of grains of the polycrystalline composition along a predetermined plane.

21. The method of claim 20, wherein growing comprises annealing, hot pressing, hot isostatic pressing, or combinations thereof.

22. The method of claim 21, further comprising providing a seed crystal to facilitate growth of the plurality of grains of the polycrystalline composition along the predetermined plane.

23. A method for solid-state conversion of a rare earth halide polycrystalline composition to a rare earth halide single crystal composition, comprising:

converting the rare earth halide polycrystalline composition to the rare earth halide single crystal composition via solid-state conversion; and growing at least one of a plurality of grains of the rare earth halide polycrystalline composition along a predetermined plane.

* * * * *

UNITED STATES PATENT AND TRADEMARK OFFICE
CERTIFICATE OF CORRECTION

| | |
|---|---|
| PATENT NO. | : 7,569,109 B2 |
| APPLICATION NO. | : 11/509129 |
| DATED | : August 4, 2009 |
| INVENTOR(S) | : Venkataramani |

It is certified that error appears in the above-identified patent and that said Letters Patent is hereby corrected as shown below:

In Column 13, Line 18, delete "filmed" and insert -- fumed --, therefor.

In Column 14, Line 37, in Claim 13, after "further" insert -- comprises --.

Signed and Sealed this

Twenty-fifth Day of May, 2010

David J. Kappos
*Director of the United States Patent and Trademark Office*